United States Patent
Turnquist et al.

(10) Patent No.: US 9,838,019 B2
(45) Date of Patent: Dec. 5, 2017

(54) FIELD EFFECT TRANSISTOR CURRENT MODE LOGIC WITH CHANGEABLE BULK CONFIGURATION OF LOAD TRANSISTORS

(75) Inventors: Matthew Turnquist, Helsinki (FI); Lauri Koskinen, Helsinki (FI); Jani Mäkipää, Espoo (FI); Erkka Laulainen, Helsinki (FI)

(73) Assignee: Minima Processor Oy, Oulu (FI)

( * ) Notice: Subject to any disclaimer, the term of this patent is extended or adjusted under 35 U.S.C. 154(b) by 770 days.

(21) Appl. No.: 13/880,399

(22) PCT Filed: Oct. 20, 2011

(86) PCT No.: PCT/FI2011/050922
§ 371 (c)(1),
(2), (4) Date: Apr. 19, 2013

(87) PCT Pub. No.: WO2012/052623
PCT Pub. Date: Apr. 26, 2012

(65) Prior Publication Data
US 2013/0207690 A1    Aug. 15, 2013

Related U.S. Application Data

(60) Provisional application No. 61/405,346, filed on Oct. 21, 2010.

(51) Int. Cl.
*H03K 19/094* (2006.01)
*H03K 19/017* (2006.01)

(52) U.S. Cl.
CPC ......... *H03K 19/094* (2013.01); *H03K 19/017* (2013.01); *H03K 19/09436* (2013.01)

(58) Field of Classification Search
CPC ........... H03K 17/04106; H03K 17/302; H03K 19/01707; H03K 19/017;
(Continued)

(56) References Cited

U.S. PATENT DOCUMENTS

2003/0214327 A1   11/2003   Huang et al.
2006/0202721 A1*  9/2006   Partow et al. .................. 327/65
(Continued)

FOREIGN PATENT DOCUMENTS

EP    2 023 487 A1    2/2009

OTHER PUBLICATIONS

Cannillo, F et al. "Nanopower Subthreshold MCML in Submicrometer CMOS Technology" (IEEE Transactions on Circuits and Systems—I:Regular Papers. vol. 56, No. 8, Aug. 2009, pp. 1598-1611.
(Continued)

*Primary Examiner* — Dylan White
(74) *Attorney, Agent, or Firm* — Renner, Kenner, Greive, Bobak, Taylor & Weber

(57) ABSTRACT

A field effect transistor current mode differential logic circuit comprising load transistors for converting the current output of each differential leg current to voltage output, and means for configuring the bulk of each differential leg's load transistor to be connected to the drain of the load transistor for use the logic circuit in Subthreshold Source Coupled Logic (STSCL) mode, and means for configuring the bulk of each leg load transistor to be connected to a voltage or to source of the same transistor for use in MOS current more logic (MCML) operation.

4 Claims, 1 Drawing Sheet

(58) Field of Classification Search
CPC ......... H03K 19/018528; H03K 19/094; H03K 19/017527; H03K 19/018514; H03K 19/09436
USPC .... 326/95, 98, 112, 115, 119, 121; 327/534, 327/536, 539
See application file for complete search history.

(56) References Cited

U.S. PATENT DOCUMENTS

| | | |
|---|---|---|
| 2006/0227594 A1 | 10/2006 | Wang et al. |
| 2008/0150584 A1* | 6/2008 | Tanaka ............. H03K 19/01852 326/83 |
| 2009/0115457 A1* | 5/2009 | Cho et al. .................... 326/115 |
| 2009/0212821 A1 | 8/2009 | Huang et al. |

OTHER PUBLICATIONS

Turnquist, MJ et al. "A Timing Error Detection Latch Using Subthreshold Source-Coupled Logic". In: Conference Ph.D. Research in Microelectronics and Electronics 2010, Prime 2010, IEEE, Sep. 27, 2010, pp. 1-4.

* cited by examiner

FIELD EFFECT TRANSISTOR CURRENT MODE LOGIC WITH CHANGEABLE BULK CONFIGURATION OF LOAD TRANSISTORS

CROSS-REFERENCE TO RELATED APPLICATION

This application is a national phase filing of PCT/FI2011/050922 filed on Oct. 20, 2011 and claims priority from U.S. Provisional Application No. 61/405,346 filed on Oct. 21, 2010.

The invention relates to improvements on MOS logic circuits working in current mode, and optimization of speed and power consumption of source coupled logic.

BACKGROUND

MOS Current Mode Logic (MCML) is a differential logic family. MCML is beneficial for high speed mixed signal integrated circuits (ICs). It has been shown to provide a number of advantages over static CMOS including less power consumption at higher frequencies, less sensitivity to switching noise, and increased process voltage temperature (PVT) immunity.

Subthreshold Source Coupled Logic (STSCL) is also a differential logic family with similar circuit topology as MCML. However, STSCL is most beneficial for ultra-low power and low frequency applications. Depending on the leakage current, activity factor, and operation frequency, STSCL can have advantages (e.g. power reduction, tunability) over static CMOS.

Prior art current mode CMOS logic circuits are described for example in patent publication "CURRENT MODE LOGIC DIGITAL CIRCUITS", US2009219054 (A1), Toumazou Christofer [GB], and Cannillo Francesco [GB]. It describes biasing and general design of MOS current more logic (MCML) including STSCL.

THE INVENTION

Switched Bulk Source Coupled Logic (sbSCL) according to the invention is a differential logic circuit variant that is able to configure itself as either MCML or STSCL. The configuration is done by switching the bulk connection of a PMOS load as is further described below. sbSCL has the advantages of both MCML and STSCL.

The object of the invention is to produce a more versatile logic circuit that can operate properly with either very high frequencies or with extremely low power consumption with good PVT immunity. This object is achieved by an insulated gate field effect transistor current mode logic circuit that comprises differential source coupled circuitry as input, and load transistors for transforming the current signal to voltage output. According to the invention the load transistor or transistors for each leg of current mode output leg are configurable so that the bulk of an operational load transistor in use is connected to drain of the same transistor, when the circuit is used in subthreshold mode as STSCL. The bulk of the load transistor in use is connected to source of the same load transistor in use or the bulk may be connected to a voltage source, when the logic circuit is used as MCML circuit. The voltage source is typically positive operation voltage of the circuit for PMOS load transistor bulk, it may be different circuit node than the source, as can be seen later.

The configuration of the load transistors may be done by switches that connect the bulk contact to either drain of the same transistor or to constant voltage, typically to source contact that is connected to the power rail of the circuit. Then each leg of the circuit needs one load transistor and two switches for selecting the bulk connection to source or to drain.

In following this embodiment is described with reference to figures. The other embodiments include use of two load transistors for each differential circuit output leg. One of the two transistors is used in STSCL mode only, and its drain and bulk terminals are connected together, the other one has its bulk connected to source or to other voltage, that allows the MCML operation.

DETAILED DESCRIPTION

Figure 1:
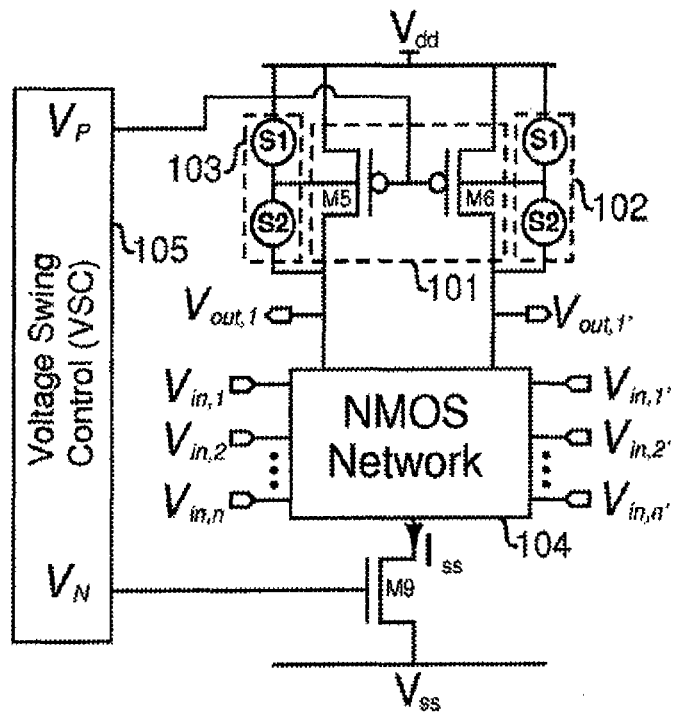
FIG. 1 is a conceptual schematic diagram of an embodiment of sbSCL according to the invention.

An embodiment of our invention, a block diagram of a generic n-input sbSCL gate is shown in FIG. 1. The sbSCL gate consists of a NMOS network (104), a Bulk Switching Unit (102, 103), and a Voltage Swing Control VSC (105). sbSCL, which is described in more detail below, is able to switch the bulk connection of the PMOS load depending on the operation frequency or required $V_{SWING}$; the $V_{SWING}$ is equal to $|V_{out,1} - V_{out,1'}|$. When the bulk is connected to the source, the sbSCL logic operates as MCML. If the bulk is connected to the drain, the sbSCL logic behaves the same as STSCL. Thus, sbSCL gives the benefits of both MCML and STSCL.

The switching between two operation modes may be done also by using two transistors. The first transistor has its bulk connected to drain and the second has its bulk connected to source or to a suitable other voltage. This configuration can be made most advantageously connecting the two PMOS load transistors in series. They may have common bulk connected to upper transistor drain and the lower transistors source and bulk is connected to the same node, so that the bulk of lower transistor is connected to its source. For STSCL operation the lower transistor is turned on and the upper transistor works essentially as controllable load resistor that is controlled by Voltage Swing Control (VSC). Drawback is that two large size (long channel) load transistors are needed, and both load transistors need a swing control that can also output low output voltage for turning the transistor on. If the bulk of the two transistors are electrically separated, the lower transistors bulk may be connected to the power rail instead of the source of the same transistor. The transistor that is not used as controlled load transistor can be considered as an additional small series resistor.

If two parallel transistors are used, the transistor with bulk connected permanently to drain would need an additional switch to disable the source-bulk diode in MCML mode, in order to prevent the diode turn on. The switch may be connected in series with the other load transistor, or it may be a transistor, that can disconnect the bulk only. There seems to be no obvious benefit for these configurations compared to other embodiments of the invention, especially FIG. 2. The two bulk connections need to be electrically separated, unlike in FIG. 2.

The NMOS network (104) within the sbSCL of FIG. 1 consists of stacked source-coupled differential pairs. The NMOS network is used to steer the bias current $I_{SS}$ to one of the two output nodes ($V_{out,1}$ or $V_{out,1'}$) based on the differential input signals $V_{in,1}=V_{in,1}-V_{in,1}'$ to $V_{in,n}=V_{in,n}-V_{in,n}'$. The bias current $I_{SS}$ can be generated by any type of current source. The output resistance of the M5 and M6 is called $R_p$, and it converts the steered bias current $I_{SS}$ back to the voltage domain in order to drive subsequent sbSCL gates. Thus, the $V_{SWING}$ is equal to $R_p*I_{SS}$. This topology allows for both combination and sequential gates whose logic depends on the connection of the NMOS source-coupled pairs.

The Bulk Switching Unit (102, 103) in FIG. 1 is used to switch the bulk connection of the PMOS load depending on the operation frequency or required $V_{SWING}$. For high operation frequencies, it is desirable to have a larger $V_{SWING}$ that can exceed the source-to-bulk diode turn on voltage of M5 or M6. To prevent this diode from turning on, S1 is switched on (and S2 off). S1 connects the bulk to source of the PMOS load as in MCML. For operation at lower operation frequencies (i.e. subthreshold voltage levels), the bulk is connected to the drain by having S2 on (and S1 off). This provides a bulk-to-drain connection of the PMOS load as in STSCL. In STSCL, VSWING must not exceed the source-to-bulk diode turn-on voltage in M5 and M6.

Figure 2:
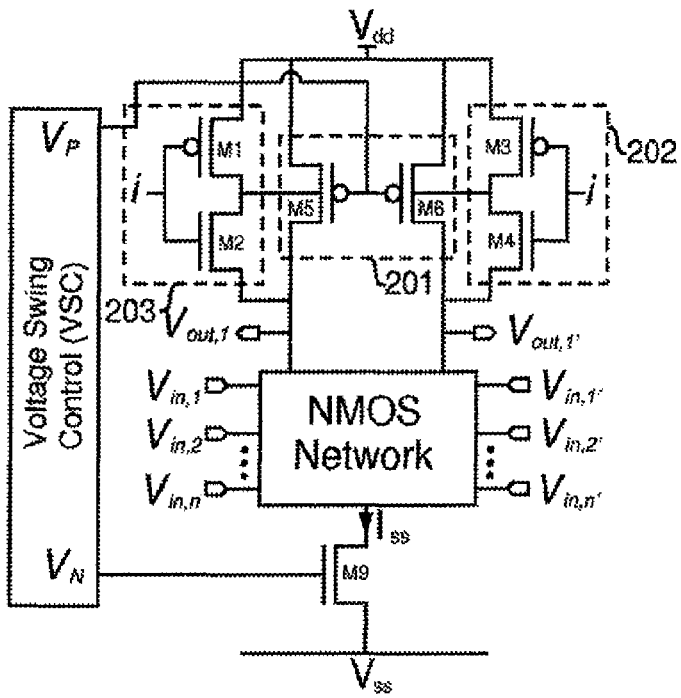
FIG. 2 is a conceptual schematic diagram of an embodiment of sbSCL according to the invention. The diagram includes CMOS transistors (202, 203) in replace of conceptual switches. These transistors may be substituted with any suitable switching means.

The implementation of the Bulk Switching Unit (202,203) is made using NMOS and PMOS transistors as shown in FIG. 2. The voltage applied to node i determines the bulk connection of the PMOS load (201). When the voltage at i is low enough to turn on M1 and M3 transistors (and M2 and M4 off), there is a bulk-to-source connection. When the voltage at i is large enough to turn on the M2 and M4 transistors (and M1 and M3 off), there is a bulk-to-drain connection. The location of the M1 and M2 (and M3 and M4) may be interchanged.

The Voltage Swing Controller (VSC) is the same as implemented in MCML and STSCL systems. It is used to ensure the desired $V_{SWING}$ is attained despite global variations (e.g. temperature, process corners). One VSC can be used for multiple sbSCL gates. The desired $V_{SWING}$ can be programmed within the VSC. The VSC sets the $V_{SWING}$ by adjusting the $V_p$ and $V_N$.

Note that term "transistor" can include bipolar-junction transistors and other types of transistors not yet know or developed. The bulk switches may be any suitable controllable switching devices. MOS transistor as load transistor can be replaced with any suitable field effect transistor, not limiting to metal gate and silicon substrate or channel. The word MOS is used in the description as synonym to any insulated gate field effect transistor in general. The word MOS transistor means therefore also polysilicon gated transistors that have other insulator than oxide, as they are generally referred as "MOS", even they are not metal gated oxide insulated. Other semiconductor materials than silicon may be used as channel material. There may be also bipolar or other type transistors used as part of the circuit.

The invention claimed is:

1. A field effect transistor current mode differential logic circuit including two fixed and always-on load transistors (M5, M6) for converting the current output of each differential leg current to a differential signaling voltage output, the logic circuit comprising:
   means for configuring a connection of the bulk of each differential current output leg's load transistor (M5, M6) to the differential signaling voltage output (Vout,1, Vout,1') when using the logic circuit in Subthreshold Source Coupled Logic (STSCL) operation, and
   means for configuring a connection of the bulk of each differential current output leg's load transistor to a differential signaling voltage source (Vdd) when using the logic circuit in MOS current mode logic (MCML) operation,
   wherein a bulk biasing voltage is supplied to the bulk of the two fixed and always-on load transistors independent of the value of the output of the differential logic circuit, and the load transistors are always connected between the differential signaling voltage source (Vdd) and the differential signaling circuit output (Vout,1, Vout,1').

2. The field effect transistor current mode differential logic circuit according to claim 1, wherein the means for configuring (102, 103) the connection of the bulk of each differential current output leg's load transistor (M5, M6) includes switch members (S1) to connect the bulk of the load transistors to the source of the same transistor, and switch members (S2) to connect the bulk of the load transistors to the drain of the same transistor.

3. A field effect transistor current mode differential logic circuit including: at least two fixed and always-on load transistors for converting the current output of each differential leg current to a differential signaling voltage output, the logic circuit, wherein one load transistor is used for Subthreshold Source Coupled Logic (STSCL) operation, such that the bulk of the transistor is connected to the differential signaling voltage output, and the other load transistor is used in MOS current mode logic (MCML) operation, such that the bulk is connected to a differential signaling voltage source (Vdd),
   wherein the differential logic circuit configures the bulk connection of the load transistors independently of the value of output of the differential logic circuit, and
   wherein the bulk connection configuration is dependent on the current source $I_{ss}$, such that in response to $I_{ss}$ being lowered for a low power and low voltage operation mode, the bulk of the load transistors is connectable to the differential signaling circuit output, and in response to $I_{ss}$ being increased for a high-frequency mode, the bulk of the load transistors is connectable to the differential signaling voltage source (Vdd).

4. A method for changing the operation of a logic circuit between a high frequency mode operation and a low power and low voltage operation mode, comprising:
   arranging an insulated gate current mode logic circuit with voltage swing control and load transistors for converting the current mode output to a differential signaling voltage output;
   enabling low power operation in a Subthreshold Source Coupled Logic (STSCL) mode by switching the load transistors so that their bulk is connected to the differential signaling voltage output, and
   enabling high frequency operation in a MOS current mode logic (MCML) mode by switching the load transistors so that their bulk is connected to their source, or so that their bulk is connected to a differential signaling voltage source (Vdd) that prevents the source-bulk diode turn on during the MCML mode.

* * * * *